US008411815B2

(12) United States Patent
Wallhead et al.

(10) Patent No.: US 8,411,815 B2

(45) Date of Patent: Apr. 2, 2013

(54) GRAZING INCIDENCE COLLECTOR FOR LASER PRODUCED PLASMA SOURCES

(75) Inventors: Ian Wallhead, La Eliana (ES); Fabio Zocchi, Samarate (IT)

(73) Assignee: Media Lario, SRL, Bosisio Parini (IT)

( * ) Notice: Subject to any disclaimer, the term of this patent is extended or adjusted under 35 U.S.C. 154(b) by 418 days.

(21) Appl. No.: 12/734,829

(22) PCT Filed: Jan. 28, 2009

(86) PCT No.: PCT/EP2009/000539

§ 371 (c)(1), (2), (4) Date: May 26, 2010

(87) PCT Pub. No.: WO2009/095220

PCT Pub. Date: Aug. 6, 2009

(65) Prior Publication Data

US 2010/0303199 A1 Dec. 2, 2010

(30) Foreign Application Priority Data

Jan. 28, 2008 (EP) .................................... 08001536

(51) Int. Cl.
*H05G 2/00* (2006.01)
*G21K 5/00* (2006.01)

(52) U.S. Cl. .......................................... 378/34; 378/119

(58) Field of Classification Search .................... 378/34, 378/35.62, 119; 250/504 R See application file for complete search history.

(56) References Cited

U.S. PATENT DOCUMENTS 6,278,764 B1 8/2001 Barbee et al.
6,586,757 B2 7/2003 Melnychuk et al.
6,633,048 B2 10/2003 Orsini
7,075,713 B2 * 7/2006 Arenberg ...................... 359/359
7,095,038 B2 8/2006 Barthod
7,164,144 B2 * 1/2007 Partlo et al. ............... 250/504 R
7,196,342 B2 * 3/2007 Ershov et al. ............. 250/504 R
7,322,708 B2 1/2008 Valenzuela et al.
7,410,265 B2 8/2008 Antoni et al.
2002/0141536 A1 10/2002 Richardson (Continued)

FOREIGN PATENT DOCUMENTS

EP 1901126 A1 9/2006
EP 1882984 A1 1/2008

(Continued)

*Primary Examiner* — Irakli Kiknadze

(74) *Attorney, Agent, or Firm* — Opticus IP Law PLLC

(57) ABSTRACT

Grazing incidence collectors (GICs) for extreme ultraviolet (EUV) and X-ray radiation sources, such as laser produced plasma (LPP) sources, are disclosed. Source-collector systems comprising GICs and LPP sources are also disclosed. A laser beam is directed along the collector axis to a fuel target to form the LPP source, and the collector is arranged to collect the radiation and reflect it to an intermediate focus. The collector may include one or more grazing-incidence mirrors, and these mirrors may be electroformed. lithography systems that employ the source-collector systems as disclosed herein.

18 Claims, 3 Drawing Sheets

U.S. PATENT DOCUMENTS

2004/0109151 A1 6/2004 Bakker et al.
2004/0160155 A1 8/2004 Partlo et al.
2006/0033895 A1 2/2006 Singer
2006/0039435 A1 2/2006 Cheymol
2006/0093253 A1 5/2006 Egle et al.
2006/0175558 A1 8/2006 Bakker et al.
2006/0215712 A1 9/2006 Ziener et al.
2007/0114470 A1 5/2007 Bowering
2007/0125964 A1 6/2007 Van Herpen
2008/0006783 A1 1/2008 Hergenhan
2008/0048134 A1* 2/2008 Shirai et al. ............... 250/504 R
2009/0161201 A1* 6/2009 Ershov et al. ................ 359/333

FOREIGN PATENT DOCUMENTS

JP 2005-522026 7/2005
WO WO 0199143 12/2001
WO WO 2007051683 5/2007
WO WO2008043577 10/2008

* cited by examiner

GRAZING INCIDENCE COLLECTOR FOR LASER PRODUCED PLASMA SOURCES

CLAIM OF PRIORITY

This application claims the benefit of priority under 35 U.S.C. §365 of International Patent Application Serial No. PCT/EP2009/000539, filed on Jan. 28, 2009, designating the United States of America, which in turn claims the benefit of priority under 35 U.S.C. §119 of European Patent Application Serial No. EP 08001536.5, filed on Jan. 28, 2008.

TECHNICAL FIELD

The present invention relates to collector optical systems for EUV and X-ray applications, and more particularly to grazing incidence collector optics for laser produced plasma (LPP) sources.

The invention has various applications in scenarios where EUV and X-ray radiation is used, but is particularly useful in lithography and imaging applications.

BACKGROUND ART

A simplified block diagram of an EUV lithography system is shown in FIG. 1 (PRIOR ART). The EUV source 102 at 13.5 nm is normally a hot plasma the emission of which is collected by the collector 104 and delivered to an illuminator 106 through an intermediate focus (IF). The latter illuminates a mask or reticle 108 with the pattern to be transferred to the wafer 110. The image of the mask or reticle is projected onto the wafer 110 by the projection optics box 112. The main purpose of the collector 104 is to deliver the maximum amount of in-band power from the source 102 to the illuminator 106, by matching the constraint due to the source 102 and the illuminator 106 itself. The ratio between the total EUV power available at the IF and the total power EUV power emitted by the source 102 in $2\pi$ sr is called collection efficiency. The primary goal of the optical design of the collector 104 is to maximize the collection efficiency while matching the boundary constraints due to the source 102 and the illuminator 106.

For preferred applications, the EUV radiation has a wavelength of the order 13.5 nm, and for this, two types of plasma sources are currently considered as possible solutions to generate the radiation: Discharge Produced Plasma (DPP) sources and Laser Produced Plasma (LPP) sources. In the former case, the plasma is generated by means of an electric discharge through the fuel (e.g. Sn, Xe, etc.), whereas in the latter case, the plasma is produced by a laser beam impacting on a fuel target (e.g. Li, Sn, Xe, etc.).

For an LPP source, the conventional configuration of choice is shown in FIG. 2 (PRIOR ART); see US 2005/0199829 Al. A single elliptical (collector) mirror 104 is placed behind the source 102. In the standard configuration, the laser beam 204 reaches the fuel target at the source (focus) 102 from the side of the mirror 104 opposite to the IF, through a hole 206 in the center of the mirror 104. The incidence angles on the mirror 104 are normally smaller than about 30°, and a multilayer coating (normally consisting of a Mo and Si stack) is required to assure enough reflectivity at 13.5 nm. Mirrors with small incidence angles will be referred to herein as Normal Incidence Mirrors (NIM). The configuration of FIG. 2 is the most efficient. However, this configuration has several drawbacks—

1) The elliptical NIM of FIG. 2 requires a complex and expensive Mo/Si multilayer coating.

2) The surface area of the NIM is relatively small and consequently the thermal load density is very high. This makes the thermal control of the NIM challenging.
3) Since plasma sources emit most of their power between about 10 nm and 120 nm, and since the multilayer coating acts as a very narrow pass-band filter reflecting only a very small bandwidth around 13.5 nm, the total thermal load is higher on the NIM. This further complicates the thermal control of a NIM.
4) The configuration of FIG. 2 prevents the use of Debris Mitigation Tools (DMT) commonly used with DPP sources. This type of DMT consists of many thin lamellas radially placed around the source and filled with a gas (e.g. Ar, N2, etc.) to slow down fast particles from the source. However, this type of DMT would completely block the radiation in the configuration of FIG. 2.
5) To overcome the erosion of the reflective layer by high-energy ions and particles from the source and to extend the lifetime of the mirror, the thickness of the reflective layer needs to be increased. However, in a MM this implies increasing the numbers of layers in the multilayer coating, also increasing the complexity and costs of the manufacturing process.
6) The ion and particle flow (per unit area) is relatively high in a NIM, due to its small area. Consequently, the erosion and/or deposition is relatively high in a NIM.

The present invention seeks to address the aforementioned and other issues.

SUMMARY OF THE INVENTION

According to one aspect of the present invention there is provided a source-collector system for EUV and X-ray applications, for example at 13.5 nm, comprising a grazing incidence collector in combination with a laser produced plasma (LPP) source.

Preferably, one or more further optical elements act upon one or more laser beams used to generate the EUV or X-ray plasma source, whereby said laser beam(s) impact(s) on the fuel target from a side thereof on which an intermediate focus is disposed.

According to another aspect of the present invention there is provided the use in EUV and X-ray applications, for example at 13.5 nm, of a grazing incidence collector in combination with a laser produced plasma (LPP) source.

According to another aspect of the present invention there is provided a collector for EUV and X-ray applications, in which radiation from a plasma source is reflected by the collector to an intermediate focus, the line joining the source and intermediate focus defining an optical axis, a first direction on the optical axis being defined from the source to the intermediate focus, characterised by the collector comprising one or more grazing incidence mirrors; and by the collector comprising one or more further optical elements for redirecting a received laser beam so as to be incident upon the source (a) in a second direction, opposite to said first direction, or (b) at an acute angle to said second direction.

In one embodiment, said one or more further optical elements comprise a plane mirror, for reflecting said received laser beam that is propagating in a direction non-parallel to the optical axis. In one embodiment, the plane mirror is disposed between the collector and the intermediate focus. In one embodiment, the plane mirror is disposed on the side of the collector opposite the source. Preferably, the plane mirror is disposed on the optical axis. Preferably, the plane mirror is disposed in a plane at 45 degrees to the optical axis, for reflecting said received laser beam that is propagating in a direction transverse to the optical axis.

In another embodiment, said one or more further optical elements comprise a spherical mirror disposed between the source and the intermediate focus, for reflecting said received laser beam that is propagating in a said first direction from a side of the source opposite the collector. Preferably, the spherical mirror is disposed between the source and the collector, or is disposed at the end of the collector nearest to the source.

In another embodiment, said one or more further optical elements comprise; a convex lens disposed a side of the source opposite the collector, for focusing said received laser beam that is propagating in a said first direction from a side of the source opposite the collector, and a plane mirror disposed between the source and the intermediate focus, for reflecting said laser beam so that it propagates in said second direction towards the source.

In another embodiment, said one or more further optical elements comprise: a plane mirror disposed on the optical axis between the collector and the intermediate focus, for reflecting said received laser beam that is propagating in a direction transverse to the optical axis, the plane mirror being disposed in a plane at 45 degrees to the optical axis, and a convex lens, disposed between the plane mirror and the source, for focusing the laser beam onto the source.

According to another aspect of the present invention, there is provided an EUV lithography system comprising: a radiation source, for example, an LPP source; a collector optical system; an optical condenser; and a reflective mask According to another aspect of the present invention there is provided a collector for application at about 13.5 nm with Laser Produced Plasma sources, the collector comprising between 5 and 16 concentrically aligned mirrors, and preferably between 6 and 12 mirrors, that operate at grazing incidence such that the maximum grazing angle between the incident radiation and the reflective surface of the mirrors is about 30°, and more preferably about 25°, in order to allow a maximum collection angle from the source of about 40° to about 85°, and preferably about 45° to about 75°.

In one embodiment, the or each mirror comprises a Wolter mirror. In one embodiment, the or each mirror comprises an elliptical mirror. In one embodiment, the or each mirror comprises an "equal reflection angle" mirror. In one embodiment, the or each mirror comprises an "off-axis Wolter" mirror.

In one embodiment, the collector comprises a plurality of concentrically aligned mirrors of different designs, the designs including Wolter, elliptical, "equal reflection angle," "off-axis Wolter" designs.

According to another aspect of the present invention there is provided a collector for application at about 13.5 nm with Laser Produced Plasma sources, the collector comprising a plurality of concentrically aligned mirrors wherein the mirrors are made from metal, preferably Ni, Cu, or Al, and are formed by diamond turning such that the mirror thickness is between about 0.5 mm and about 4 mm and preferably between about 1 mm and about 3 mm.

According to another aspect of the present invention there is provided a collector for application at about 13.5 nm with Laser Produced Plasma sources, the collector comprising a plurality of concentrically aligned mirrors, wherein the mirrors are made by metal electroforming, preferably Ni or Cu, such that the mirror thickness is between about 0.5 mm and about 4 mm and more preferably between about 1 mm and about 3 mm.

According to another aspect of the present invention there is provided a collector for application at about 13.5 nm with Laser Produced Plasma sources, the collector comprising a plurality of concentrically aligned mirrors, wherein the mirrors are made of a multilayer of electroformed metals, the multilayer comprising a thin layer of Ni, preferably with a thickness of about 0.01 mm to about 0.3 mm, followed by a thick layer of Cu, preferably with a thickness between about 0.5 mm and about 4 mm, followed by a thin layer of Ni, preferably with a thickness of about 0.01 mm to about 0.3 mm.

According to another aspect of the present invention there is provided a collector for application at about 13.5 nm with Laser Produced Plasma sources, the collector comprising a plurality of concentrically aligned mirrors, wherein the mirrors are made by a multilayer of electroformed metals consisting of a thin layer of NiCo alloy, preferably with a thickness of about 0.01 mm to 0.3 mm, followed by a thick layer of Cu, preferably with a thickness between 0.5 mm and 4 mm, followed by a thin layer of NiCo alloy, preferably with a thickness of about 0.01 mm to 0.3 mm.

Preferably, the electroformed mirrors have a surface roughness preferably below 2 nm in the spatial wavelength range between 1 mm and 10 nm more preferably, below 1 nm in the spatial wavelength range between 1 mm and 10 nm.

According to another aspect of the present invention there is provided a collector for application at about 13.5 nm with Laser Produced Plasma sources, the collector consisting of a plurality of concentrically aligned mirrors wherein the mirrors are produced by an electroforming process in which the separation layer comprises a material different from Au, or in which Au is confined between the mirror substrate and the reflective coating by using a suitable barrier material so that substantially no Au can escape.

According to another aspect of the present invention there is provided a collector for application at about 13.5 nm with Laser Produced Plasma sources, the collector comprising a plurality of concentrically aligned mirrors wherein the mirrors have a surface roughness preferably below 2 nm in the spatial wavelength range between 1 mm and 10 nm and, more preferably, below 1 nm in the spatial wavelength range between 1 mm and 10 nm.

According to another aspect of the present invention there is provided a collector for application at 13.5 nm or thereabouts with Laser Produced Plasma sources, the collector comprising a plurality of concentrically aligned mirrors and an integrated thermal management, wherein the integrated thermal management system maintains, in use, the temperature of the mirrors and the supporting structure substantially constant in time, preferably within ±5° C. and more preferably within ±2° C. and even more preferably within ±1° C. with respect to a desired temperature, and/or substantially uniform over the mirror surface, preferably within ±5° C. and more preferably within ±2° C. and even more preferably within ±1° C. with respect to a desired temperature.

Preferably, the integrated thermal management includes a control feedback loop and control software.

Alternatively or additionally, the integrated thermal management includes cooling and heating elements mounted on one or more of the mirrors thereon, for example on the rear side thereof. Preferably, the cooling and heating elements comprises pipelines cooled by fluids or phase-transition fluids, Peltier cells, micro-channels obtained by micro-machining the rear surface of the mirrors or by proper masking the rear surface of the mirror during the electroforming process, pipelines heated by a suitable fluid or wires heated by Joule effect.

According to another aspect of the present invention there is provided a collector for application at about 13.5 nm with Laser Produced Plasma sources, the collector comprising a plurality of concentrically aligned mirrors, wherein a shield in the form of a thin circular annulus with the same dimensions of the mirror edge is disposed in front of an entrance edge of one or more mirrors and attached thereto by a mechanical coupling with negligible or limited thermal contact with the mirror, such that the shield completely or partially prevents the radiation from the source or from the debris mitigation tool irradiating the mirror edge.

According to another aspect of the present invention there is provided a collector for application at about 13.5 nm with Laser Produced Plasma sources, the collector comprising a plurality of concentrically aligned mirrors, wherein a cooled pipeline is attached in front of an entrance edge of one or more mirrors.

According to another aspect of the present invention there is provided a collector for application at about 13.5 nm or thereabouts with Laser Produced Plasma sources, the collector comprising a plurality of concentrically aligned mirrors, wherein the optical surfaces are coated by a reflective layer, the reflective layer preferably being made of (a) one of Pd, Au, Ir, Pt, Mo, Rh, and more preferably Ru, or (b) a nano-composite alloy of two or more of Pd, Au, Ir, Pt, Mo, Rh, and Ru, with the reflective layer having a thickness between about 50 nm and about 500 nm; and the reflective layer along the length of the collector being for example of uniform in thickness.

According to another aspect of the present invention there is provided a collector for application at about 13.5 nm with Laser Produced Plasma sources, the collector comprising a plurality of concentrically aligned mirrors, wherein optical surfaces of the mirrors are coated by a reflective layer made of (a) one of Pd, Au, Ir, Pt, Mo, Rh, and Ru, or (b) a nano-composite alloy of two or more of Pd, Au, Ir, Pt, Mo, Rh, and Ru, with the reflective layer having a thickness between about 500 nm and about 3000 nm in order to extend the collector lifetime against erosion from debris from the source; and the reflective layer along the length of the collector being for example of uniform in thickness.

According to another aspect of the present invention there is provided a collector for application at about 13.5 nm with Laser Produced Plasma sources and debris mitigation tools, the collector comprising a plurality of concentrically aligned mirrors, wherein the geometry of the collector matches the geometry of the debris mitigation tools.

According to another aspect of the present invention there is provided a collector for application at about 13.5 nm with Laser Produced Plasma sources and debris mitigation tools, the collector comprising a plurality of concentrically aligned mirrors and a support structure, wherein the support structure of the collector and the debris mitigation tools have matched dimensions and are aligned to avoid additional obscuration and to maximize the combined collection efficiency of the debris mitigation tool and the collector.

According to another aspect of the present invention there is provided a collector for application at about 13.5 nm with Laser Produced Plasma sources, the collector comprising a plurality of concentrically aligned mirrors, wherein one or more of the mirrors has mounted thereon, for example on the rear side thereof, one or more devices for the mitigation of debris from the source, for example erosion detectors, solenoids and RF sources.

According to another aspect of the present invention there is provided a collector for application at about 13.5 nm with Laser Produced Plasma sources, the collector comprising a plurality of concentrically aligned mirrors and a support structure, wherein the collector is made of non-ferromagnetic materials.

According to another aspect of the present invention there is provided a collector for application at about 13.5 nm with Laser Produced Plasma sources, the collector comprising a plurality of concentrically aligned mirrors, wherein non-reflective surfaces of the mirrors are coated by a protective layer of Rh and preferably with a thickness between about 50 nm and about 3000 nm, and preferably deposited by galvanic plating.

Preferably, the mirrors consist of electroformed Cu preferably with a thickness between about 0.5 mm and about 4 mm, a reflective layer, preferably of thickness between 50 mm and 3000 nm and more preferably between about 500 and about 3000 nm, on an optical surface of the electroformed Cu, wherein the reflective layer thickness along the length of the collector is for example uniform.

According to another aspect of the present invention, there is provided a method of manufacturing the collector, comprising: preparing masters; electroforming the mirrors on the masters; wherein the masters are manufactured by diamond turning and polished such that the masters have a surface roughness in the spatial wavelength range between 1 mm and 10 nm of below 2 nm, and preferably below 1 nm.

According to another aspect of the present invention, there is provided a method of manufacturing masters, the masters being for the fabrication of mirrors by electroforming, the mirrors being for use in a collector, the method comprising diamond turning and polishing a substrate to form the master, such that the masters have a surface roughness in the spatial wavelength range between 1 mm and 10 nm of below 2 nm, and preferably below 1 nm.

In accordance with preferred embodiments of the invention, a plurality of concentrically aligned two-reflection mirrors is used for the collector, for example a type I Wolter collector. The incidence angles on the mirror(s) of the collector are normally larger than c. 60° (i.e. grazing angle <c. 30°) and a single layer coating on the mirror surface (using for example Ru, Pd, etc.) is enough to assure large transmission at 13.5 nm. Mirrors with large incidence angles will be referred to herein as Grazing Incidence Mirrors (GIM).

An advantage of the invention is that the GIM (e.g. FIG. 3) only needs a reflective monolayer coating of Ru, Pd, etc., rather than a multilayer.

A further advantage of the invention is that the surface area of the GIM is much larger than the one of the NIM and consequently the thermal load density is much lower in the former case, facilitating thermal control.

A further advantage is that the use of a monolayer with the GIM omits narrow pass-band filter effects of the multilayer, so that the total thermal load is lower on a GIM than on a NIM.

A further advantage of the invention is that the use of Debris Mitigation Tools (DMT) commonly used with DPP sources is also enabled.

A further advantage is that there is reduced or no need to increase the thickness of the reflective layer by increasing the numbers of layers in the multilayer coating, to overcome the erosion of the reflective layer by high energy ions and particles from the source and extend the lifetime of the mirror. In a GIM, only the thickness of the single reflective coating needs to be increased.

A further advantage is that the ion and particle flow (per unit area) is lower in a GIM than in a NIM, due to the larger area of the GIM. Consequently, at equal ion and particle flow rate, the erosion and/or deposition is lower in a GIM than in a NIM.

BRIEF DESCRIPTION OF THE FIGURES

Embodiments of the invention will now be described in detail, by way of example, with reference to the accompanying drawings, in which.

DETAILED DESCRIPTION OF EMBODIMENTS

In the description and drawings, like numerals are used to designate like elements. Unless indicated otherwise, any individual design features and components may be used in combination with any other design features and components disclosed herein.

In the illustrations of optical elements or systems herein, unless indicated otherwise, cylindrical symmetry around the optical axis is assumed; and references to an "image focus" are references to an image focus or to an intermediate focus.

Figure 3:
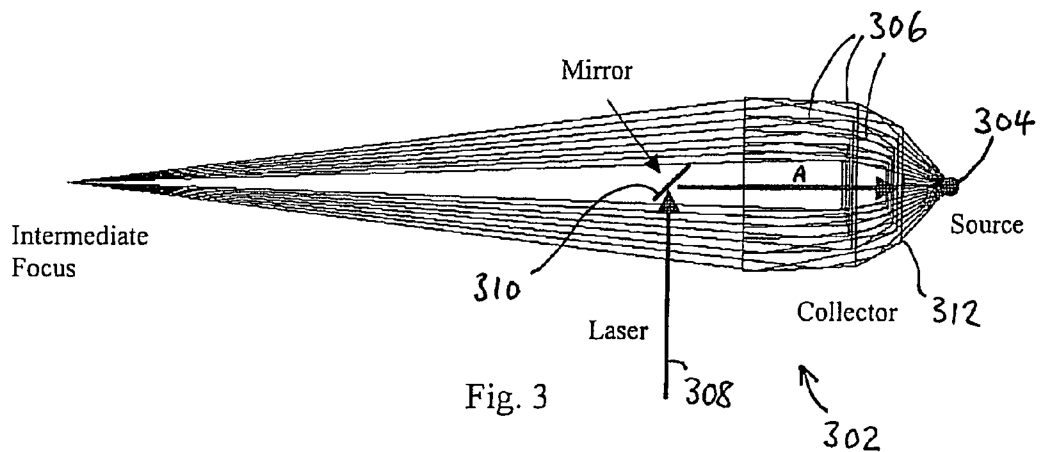
FIG. 3 shows a grazing incidence collector according to a first embodiment of the invention, for use with a LPP source.

FIG. 3 shows a grazing incidence collector 302 according to a first embodiment of the invention, for use with a LLP source 304. The collector 302 consists of a plurality of concentrically aligned mirror shells 306; in this embodiment, there are six mirrors 306, as shown in FIG. 3; however, it will be appreciated that any suitable number of mirrors may be used. Each mirror 306 may have the same or different design, including, but not limited to, Wolter, elliptical, "equal reflection angle," and "off-axis Wolter" designs. The design of such "equal reflection angle" grazing incidence collectors is discussed in, for example, European patent application no. 06425539.1. The design of such "off-axis Wolter" grazing incidence collectors is discussed in, for example, European patent application no. 06425634.9.

Figure 4:
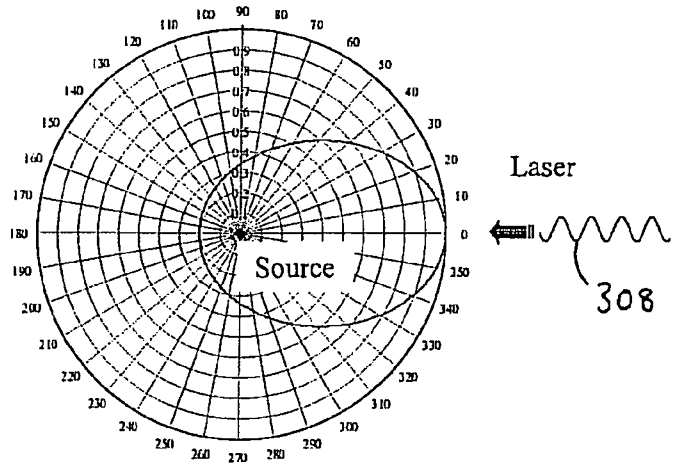
FIG. 4 illustrates the angular distribution of the radiated EUV power for the LPP source used with the collector of FIG. 3.

In this embodiment, the laser beam 308 propagates from the same side of the collector 302 as the IF, through a flat folding mirror 310. After reflection at the mirror 310, the laser beam 308 propagates (in the direction of arrow A) towards the source (fuel) 304 (e.g. Li, Sn, Xe, etc.). The angular emission of LPP sources 304 may be anisotropic, with the peak emission in the direction opposite to the laser beam propagation. An example of the angular distribution of the radiated EUV power is shown in FIG. 4. Returning to FIG. 3, in this case, if the emission from the source 304 is anisotropic, the maximum intensity of the radiation being emitted is toward the collector 302 (i.e. opposite to arrow A).

Collector Mirrors (Shells)

In a concentric mirror configuration, like the Wolter design shown in FIG. 3, the thickness of the mirror(s) 306 has a direct impact on the collection efficiency, as part of the EUV radiation emitted from the source 304 is blocked by the mirror thickness. To achieve the maximum possible collection efficiency, the thickness of the mirror(s) 306 must be kept as small as possible. Therefore, metal is suitably used for the manufacturing of the mirrors 306: this allows a small mirror thickness and provides enough mechanical and structural stiffness to avoid the mirror deforming under its own weight.

Since the fraction of EUV radiation emitted from the plasma source is only a small fraction of the total power radiated by the source, a large amount of power, in the order of several kilowatts, hits the reflecting surface of the collector mirrors. Part of this power is absorbed by the collector and must be removed by a properly designed cooling system to avoid excessive deformation of the mirror. Thus, the use of a metal for the manufacturing of the mirror provides a large enough thermal conductance to allow the thermal power absorbed by the mirrors to flow to the cooling system.

The mirror thickness must be properly chosen as a trade off between the need to limit the obscuration of the radiation from the source and the need to increase the thermal conductance as much as possible. Thus, in typical applications, the thickness is between about 0.5 mm and about 4 mm.

Similarly, the choice of metal for the mirror(s) 306 is a trade off between the need to ensure the mirror 306 is stiff enough and the need to increase the thermal conductance as much as possible. Examples of materials suitable for mirror manufacturing are Ni, Al, Cu. As the mirrors for EUV and X-ray applications need high accuracy and very low roughness (preferably below 1-2 nm rms), the mirrors are suitably manufactured by Diamond Turning, which is known to persons skilled in the art.

Alternatively, the metal mirrors may be manufactured by electroforming from a negative master (not shown), using techniques known to persons skilled in the art (see, for example WO0184747). Fabrication by electroforming allows:

1. the manufacturing of thin metal shells;
2. the replication of the shape of the master and, in particular for a two reflection mirror, the replication of the two reflecting surfaces in monolithic structure without the need of further optical alignment between the two surfaces.
3. the replication of master roughness that can be polished typically below the 1-2 nm rms (required to ensure high enough reflectivity in the spatial wavelength range between 1 mm and 10 nm) much more easily than the inner surface of the mirror.

As the electroforming process replicates the shape of the master, the latter must have a surface accuracy good enough to assure acceptable optical performance of the final mirrors. To achieve better performance, the masters can be manufactured by diamond turning.

Electroformed mirrors may be manufactured in a variety of metals including Ni and Ni—Co alloys. Electroformed mirrors can also be manufactured in Cu, which enables a larger thermal conductance. In the latter case, since copper may cause contamination and its use may not be allowed in the operating environment, the electroformed mirrors can be manufactured in a multilayer structure consisting of a thin layer of Ni, preferably with a thickness in the range about 0.01 mm to about 0.3 mm, followed by a thick layer of Cu, preferably with a thickness between 0.5 mm and 4 mm, followed by a thin layer of Ni, preferably with a thickness in the range about 0.01 mm to about 0.3 mm. Alternatively, the electroformed mirrors can be manufactured in a multilayer structure consisting of a thin layer of Ni—Co alloy, preferably with a thickness in the range about 0.01 mm to about 0.3 mm, followed by a thick layer of Cu, preferably with a thickness between 0.5 mm and 4 mm, followed by a thin layer of Ni—Co alloy, preferably with a thickness in the range about 0.01 mm to about 0.3 mm.

Before the electroforming process, a suitable separation layer is deposited onto the master to allow the release of the mirror from the master at the end of the electroforming process. A typical material used as a separation layer is Au (gold), which sticks on the whole optical surface of the mirror after the release. As Au may contaminate the operating environment it may not be allowed in such environments. In this case, two solutions can be used:

1. a different separation layer can be chosen, for example an inert ceramic material, like a nitride, a carbide or a carbo-nitride layer, which will not stick on the mirror surface
2. the Au can be confined between the mirror substrate and the reflective layer by using a suitable barrier material.

In addition, the collector 302 may be equipped with an integrated thermal management system (not shown) to keep the temperature of the shells (mirrors 306) substantially constant and uniform, and to avoid excessive deformation induced by the large thermal load from the plasma source 304. The thermal management system (not shown) is integrated on the rear surface of the mirrors 306 in a region where it does not block the optical path of the radiation from the source 304. The integrated thermal management system (not shown) may include cooling elements such as (a) pipes cooled by a suitable fluid, (b) Peltier cells, (c) pipes cooled by phase-transition fluids, (d) micro-channels obtained by micro-machining the rear surface of the mirrors or by suitable masking the rear surface of the mirror during the electroforming process. The integrated thermal management system (not shown) may alternatively or additionally include heating elements such as pipes heated by a suitable fluid or wires heated by Joule effect. The integrated thermal management system (not shown) may alternatively or additionally include temperature sensors and thermal control hardware and software.

All the above elements may be integrated in the thermal management system (not shown) that includes a feedback control loop. In such integrated management system (not shown), the temperature profiles of the mirrors 306 and any supporting structures are monitored in real time and used as feedback signals to activate the cooling elements (not shown) and the heating elements (not shown) and keep the temperature of the mirrors 306 and the supporting structure constant in time and uniform on the mirror surface. In each case, such control involves a deviation from a desired temperature within ±5° C. and more preferably within ±2° C. and even more preferably within ±1° C.

As the thermal load on the entrance edge 312 of the mirror 306 is at near normal incidence angle, such thermal load is fully absorbed by the edge 312, potentially causing large local deformation of the adjacent reflecting surface. To prevent such heating, optionally one or both of the two following solutions can be adopted:

1. a shield (not shown), in the form of a thin circular annulus with the same dimensions of the mirror edge, is placed in front of the mirror entrance edge 312 through a mechanical coupling (not shown) with negligible or limited thermal contact with the mirror.
2. A fluid-cooled pipeline (not shown) is attached in front of the mirror entrance edge 312.

The support structure (not shown) of the collector 302, to which the mirror shells 306 are attached, optionally are also cooled, for example to reduce or eliminate the effects of the thermal load due to thermal radiation from surrounding bodies (not shown), due to spurious plasma in the vacuum chamber (not shown), etc.

Since the plasma source 304 generates contaminating and eroding materials in the form of ions, neutral atoms and debris, the reflective coating (not shown) of the collector mirrors 306 is preferably protected by using a suitable debris mitigation tool (DMT) (not shown) and cleaning techniques. The collector 302 must then be compatible with the DMT (not shown) in terms of dimensions, positions of supporting structures (not shown), to limit obscurations, etc. The collector 302 itself may optionally be equipped with debris mitigation or protective systems (not shown), for example erosion detectors, solenoids and RF sources, protective layers. The collector is preferably also designed to be compatible with the cleaning environment needed to remove deposition of non-reflective materials onto the optical (mirror) surface. In particular, all non-optical surfaces are suitably covered by a protective layer, preferably Rh with a thickness between 50 nm and 3000 nm, so as to be chemically resistant to the cleaning environment. One convenient method of depositing the protective coating material (not shown) is by galvanic plating, since it allows the coating of complex surfaces such as the rear surfaces of the mirrors 306 and the supporting structure (not shown).

On the reflecting surfaces (not shown) of the mirrors 306, the thickness of the reflective coating (not shown) is suitably between about 50 nm and about 500 nm. However, in the presence of energetic ions and neutrals, and debris from the plasma source 304 (with energy above the optical material sputtering threshold), the reflective coating (not shown) may be eroded. In order to extend the collector lifetime, a reflective coating (not shown) of greater thickness is preferably used, preferably up to a thickness between 500 nm and 3000 nm or more. The thickness of the reflective coating along the length of the collector may be but need not be uniform.

In LPP sources, one convenient method for controlling the flux and spectrum of ions from the plasma source 304 is through an appropriate magnetic field. Optionally, therefore, the collector 302 is surrounded by an electromagnet (not shown) for producing a strong magnetic field (of the order of 1 T or more). This field may be strong enough to cause deformation of the collector 302 if it contains ferromagnetic materials, such as Ni or Ni—Co alloys. Thus, in this case, non-ferromagnetic material must then be used to fabricate the collector 302. For example, the collector 302 may be manufactured in electroformed Cu and be protected by a thick reflective coating (e.g. Ru; not shown) on the optical surface and by a thick protective galvanic coating (e.g. Rh; not shown) on the non-optical surfaces.

Mirror Numbers and Geometries

Figure 1:
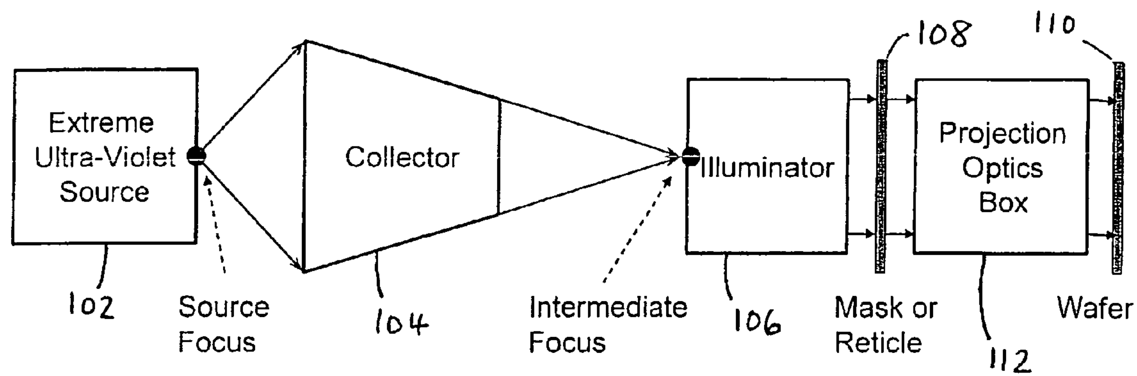
FIG. 1 (PRIOR ART) shows an example of a known EUV lithography system.

Referring once again to FIGS. 1 and 3, the maximum exit numerical aperture (NA) of the collector 302 is normally limited by the entrance NA of the illuminator 106. This restriction, together with practical limits in the distance between the source 304 and the IF, also sets a limit to the length of the mirrors 306. Due to this limitation, each mirror 306 may collect only an angular fraction of the radiation from the source 304. In order to maximize the collection efficiency, the largest angle captured by the collector 302 from the source 204 must also be maximized. Consequently, a plurality of mirrors 306 must be concentrically aligned to cover the desired angular range from the source 304, typically such that the maximum collected angles lies between about 40° and about 85°. According to the first embodiment of the invention (FIG. 3), six concentric mirrors 306 are employed; however, in preferred embodiments, the number of concentric mirrors 306 in a collector 302 is between 5 and 16.

Mirror Coatings

In order to achieve sufficient reflectivity at the typical operating wavelength of 13.5 nm, the optical surface of the mirrors 306 is coated by a suitable material, here referred as "the reflective layer", preferably made (but not limited to) of Pd, Ir, Pt, Mo, Rh, and more preferably Ru.

Besides homogeneous single layer materials as the reflective layer (mainly for thickness exceeding about 500 nm), also nano-structured layers composed by one or more EUV elements from the above list, with the structure of a multilayer with nanometer periodicity or nano-composite obtained by (co)deposition of one or more EUV reflective elements with alternating structure and growth parameters can be used. These materials include multilayers of two elements (such as, for example, Mo, Ru, Zr, Nb Pd) with different nanostructure and interfaces (e.g. amorphous/amorphous, nanocrystalline/amorphous, etc.). Optionally, as part of the preparation method, there may be added a reactive gas (such as $H_2$, $O_2$ and $N_2$) to deposit nitrides, hydrides and (sub)oxides of the above mentioned elements. The entire reflective layer so obtained is stress compensated (i.e. almost stress free or with a final residual stress adequate to obtain a mechanically stable optical layer with the substrate), with overall maximum thickness of about several micrometers (e.g. about 3-5 micrometers). The preferred method of deposition for these structured layers is physical, using plasma and ion assistance (sputtering, reactive sputtering, evaporation etc.) but it is not limited to these preparation methods. The materials of the reflective layer may be already nano-alloyed as the result of the deposition process, or may be post-treated to reach the final nanostructure. One variant of the above reflective layer composition is as follows: rather than a plurality, a single element (such as, for example, Mo, Ru, Zr, Nb or Pd) with modulated electronic and physical properties, obtained by ion bombardment during growth to change the film density and intrinsic residual stress, is formed. This stress-compensated nanostructured EUV layer exhibits high EUV reflectivity and can be grown to a maximum of several micrometers (e.g. about 3-5 micrometers).

The angle between the incoming radiation and the reflecting surface of the mirrors 306 must be kept below a certain limit, beyond which the reflectivity of the reflective coating drops to small values, thus decreasing the collection efficiency. For typical coating materials (Ru, Pd, Au, Ir, Pt, Mo, Rh), this grazing angle is between about 20-30°. The optical design of the collector mirror is preferably such that the grazing angle is below 30°.

Figure 5:
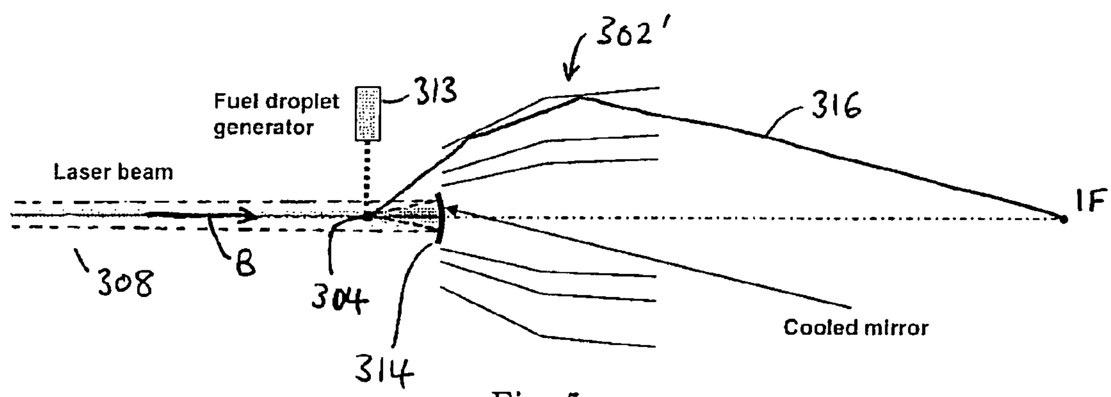
FIG. 5 shows a grazing incidence collector according to a second embodiment of the invention.

FIG. 5 shows a grazing incidence collector according to a second embodiment of the invention. This is the same as the first embodiment, except as follows. In this embodiment, the laser beam 308 propagates initially from the side of the collector 302' opposite the IF (i.e. in the direction of arrow B) and is reflected back and focused onto the fuel target (corresponding to source focus 304, and produced by fuel droplet generator 313) by means of a spherical mirror 314. The mirror 314 may be a cooled mirror. An exemplary consequent emitted/reflected EUV ray is indicated by 316.

Figure 6:
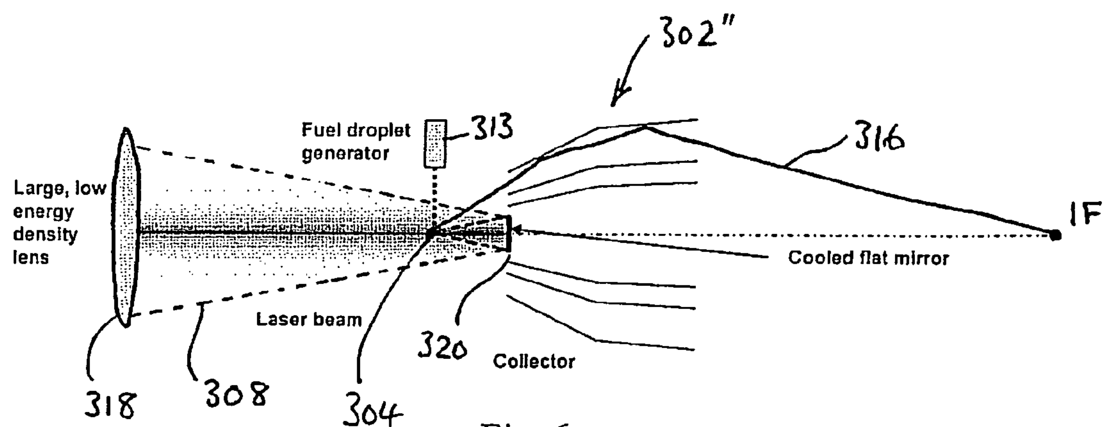
FIG. 6 shows a grazing incidence collector according to a third embodiment of the invention.

FIG. 6 shows a grazing incidence collector according to a third embodiment of the invention. This is the same as the first embodiment, except as follows. Again, laser beam 308 propagates initially from the side of the collector 302" opposite the IF. It is focused by a large diameter lens 318, which therefore is subjected to lower laser pulse energy density. The beam 308 is then reflected back onto the fuel target fuel target (corresponding to source focus 304, and produced by fuel droplet generator 313) by means of a flat mirror 320. The mirror 320 may be a cooled mirror. An exemplary consequent emitted/reflected EUV ray is indicated by 316.

Figure 7:
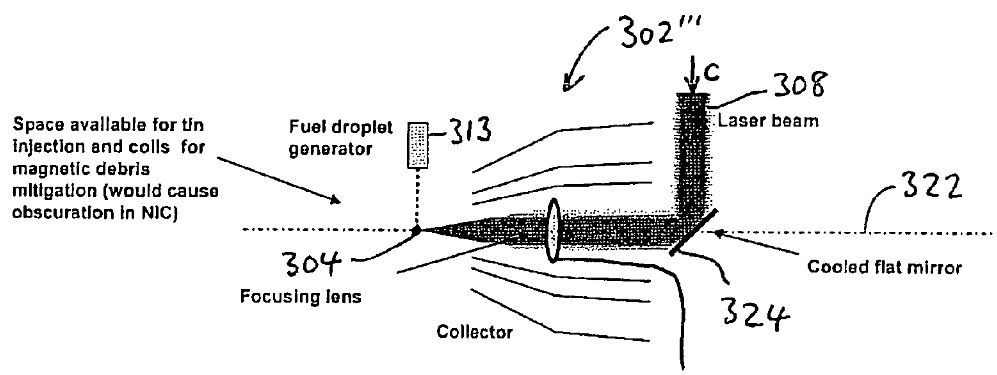
FIG. 7 illustrates a grazing incidence collector according to a fourth embodiment of the invention.

FIG. 7 illustrates a grazing incidence collector according to a fourth embodiment of the invention. This is the same as the first embodiment, except as follows. In this embodiment, the laser beam 308 propagates perpendicularly to the optical axis 322 of the collector 302'". The beam 308 is then folded by 90° by means of a flat mirror 324 (located on the optical axis on the same side of the collector 302'" as the IF) and is focused onto the fuel target (corresponding to source focus 304, and produced by fuel droplet generator 313) by means of a lens 326. In this case, a rather large volume 328 is available for generating fuel droplets, for the hardware (not shown) needed to generate magnetic fields, etc.

Figure 2:
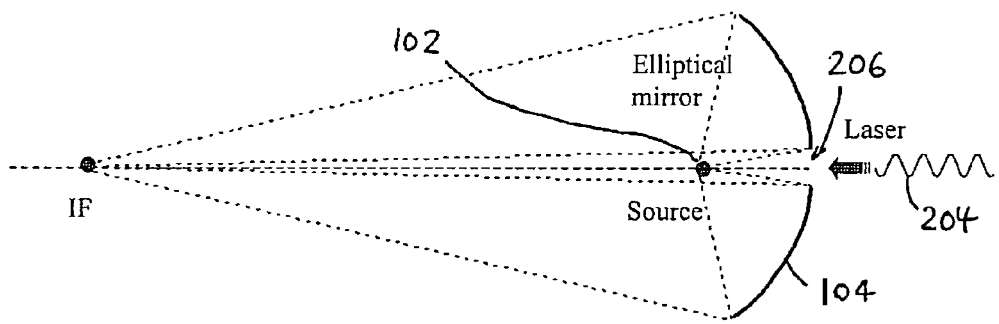
FIG. 2 (PRIOR ART) depicts an example of the collector optics for the EUV lithography system of FIG. 1, for use with a LPP source.
Figure 8:
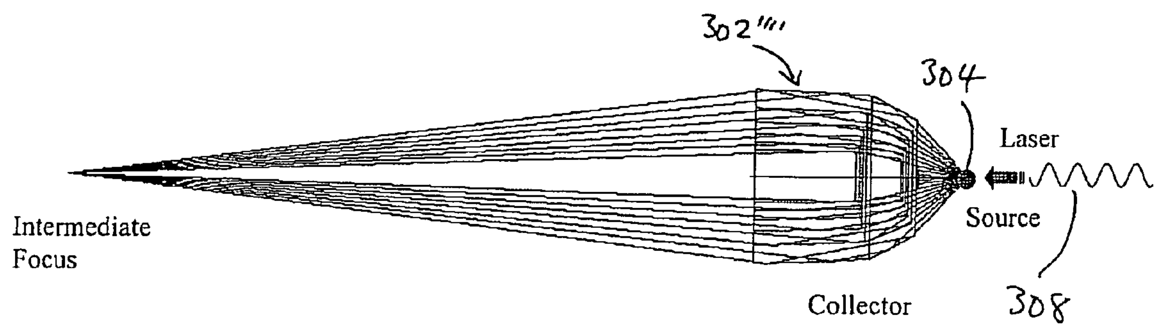
FIG. 8 shows a grazing incidence collector according to a fifth embodiment of the invention.

FIG. 8 shows a grazing incidence collector according to a fifth embodiment of the invention. This is the same as the first embodiment, except as follows. Again, laser beam 308 propagates initially from the side of the collector 302"" opposite the IF. However, in this case the laser beam is incident directly on the source. When the source angular emission is anisotropic (FIG. 4), the configuration of FIG. 8, which is the extension of FIG. 2 and in which the laser beam is propagating from the side of the collector 302"" opposite the IF, is substantially less efficient because the maximum of the emission from the source takes place in the direction opposite to the collector.

Other embodiments are possible as a variation of those here described. For example, more than one laser beam may be used to generate the EUV plasma. It will also be appreciated that the laser beam, upon impact with the fuel target (at the source focus), need not be propagating along the optical axis, but at an angle thereto.

Encompassed by the invention are collector optics for imaging (e.g., EUV or X-ray), EUV lithography systems (FIG. 1) and imaging systems incorporating such optics; the design of such imaging optics and imaging systems is discussed in, for example, European patent application no. 06425539.1.

The invention claimed is:

1. A source-collector system for extreme ultraviolet (EUV) or X-ray radiation, comprising in order along a system axis:
- a mirror;
- a grazing incidence collector having an intermediate focus and input and output ends;
- a laser-produced plasma (LPP) source adjacent the output end of the grazing incidence collector;
- wherein the LPP source includes a fuel target irradiated by a laser beam to generate the EUV or X-ray radiation, wherein the laser beam is reflected from the mirror and directed to pass in a direction through the grazing incidence collector from the input end to the output end and along the system axis to the fuel target, and wherein the fuel target emits the EUV or X-ray radiation in response to being irradiated by the laser beam, the EUV or X-ray radiation having a peak emission in the direction opposite to the direction of the laser beam; and
- wherein the grazing incidence collector collects a portion of the EUV or X-ray radiation and directs it to the intermediate focus, which resides on the system axis beyond the mirror.

2. A source-collector system according to claim 1, wherein the fuel target includes Li, Sn or Xe.

3. A source-collector system according to claim 2, wherein the fuel target includes a fuel droplet dispensed from a fuel droplet generator.

4. A source-collector system according to claim 1, further including a lens operably arranged to focus the laser beam onto the fuel target.

5. A source-collector system according to claim 1, wherein the grazing incidence collector comprises concentrically arranged or nested shells of grazing-incidence mirrors.

6. A source-collector system according to claim 5, wherein the grazing-incidence mirrors are formed from electroformed metal.

7. A source-collector system according to claim 6, wherein the grazing-incidence mirrors each have an optical surface with a reflective coating.

8. A lithography system comprising:

the source-collector system of claim 1;

an optical condenser arranged relative to the source-collector to receive the EUV or X-ray radiation therefrom; and a reflective mask arranged to receive the EUV or X-ray radiation from the optical condenser.

9. A source-collector system for extreme ultraviolet (EUV) or X-ray radiation, comprising along an axis:

a laser-produced plasma (LPP) source that includes a fuel target;

a grazing incidence collector having an input end and an output end and arranged along the axis with the LPP source adjacent the output end, the grazing incidence collector comprising nested electroformed mirrors;

a laser that produces a laser beam, wherein the laser beam is directed to the fuel target along the axis and through the nested electroformed mirrors from the input end to the output end of the grazing incidence collector to cause the generation of the EUV or X-ray radiation, wherein the EUV or X-ray radiation has a peak emission along the axis and in a direction opposite the direction of the laser beam; and wherein the nested electroformed mirrors are configured to collect a portion of the EUV or X-ray radiation and reflect it to an intermediate focus that resides adjacent the input end of the grazing incidence collector.

10. The source-collector system of claim 9, further including a mirror arranged along the axis adjacent the input end of the grazing incident collector and configured to reflect the laser beam along the axis and through the grazing-incidence collector.

11. The source-collector system of claim 9, wherein the fuel target comprises droplets of Sn dispensed by a fuel droplet generator.

12. The source collector system of claim 9, wherein each electroformed mirror includes an optical surface with a reflective coating.

13. The source-collector system of claim 9, wherein the electroformed mirrors are concentrically aligned.

14. A lithography system comprising:

the source-collector system of claim 9;

an optical condenser arranged relative to the source-collector to receive the EUV or X-ray radiation therefrom; and a reflective mask arranged to receive the EUV or X-ray radiation from the optical condenser.

15. A method of collecting extreme ultraviolet (EUV) or X-ray radiation, comprising:

providing a grazing incidence collector having a collector axis, input and output ends, and an intermediate focus adjacent the output end;

arranging a fuel target on the collector axis between the intermediate focus and the output end of the grazing incidence collector;

irradiating the fuel target with a laser beam that travels along the optical axis through the grazing incidence collector from the input end to the output end, wherein the laser beam directly converts the fuel target to a laser-produced plasma (LPP) source that emits the EUV or X-ray radiation with a peak emission along the axis and in a direction opposite the direction of the laser; and collecting a portion of the EUV or X-ray radiation with the grazing-incidence collector and grazingly reflecting the collected radiation to the intermediate focus.

16. The method of claim 15, including providing the fuel target as a droplet of Sn from a fuel droplet generator.

17. The method of claim 15, including reflecting the laser beam with a mirror to direct the laser beam along the optical axis.

18. The method of claim 15, including forming the grazing incidence collector from concentrically arranged electroformed mirrors.

* * * * *